United States Patent
Fujikawa et al.

(10) Patent No.: US 6,916,735 B2
(45) Date of Patent: Jul. 12, 2005

(54) METHOD FOR FORMING AERIAL METALLIC WIRING ON SEMICONDUCTOR SUBSTRATE

(75) Inventors: Takao Fujikawa, Takasago (JP); Tetsuya Yoshikawa, Takasago (JP)

(73) Assignee: Kabushiki Kaisha Kobe Seiko Sho, Kobe (JP)

( * ) Notice: Subject to any disclaimer, the term of this patent is extended or adjusted under 35 U.S.C. 154(b) by 0 days.

(21) Appl. No.: 10/259,501

(22) Filed: Sep. 30, 2002

(65) Prior Publication Data

US 2003/0077892 A1 Apr. 24, 2003

(30) Foreign Application Priority Data

Sep. 28, 2001 (JP) ........................ 2001-303380

(51) Int. Cl.⁷ ............... H01L 21/4763; H01L 21/76
(52) U.S. Cl. ................... 438/619; 438/421; 438/422
(58) Field of Search .................... 438/456, 455, 438/619, 421, 422

(56) References Cited

U.S. PATENT DOCUMENTS

| | | | | |
|---|---|---|---|---|
| 3,850,710 A | * | 11/1974 | Wen | |
| 4,263,606 A | * | 4/1981 | Yorikane | ..................... 257/737 |
| 4,939,101 A | * | 7/1990 | Black et al. | |
| 5,654,226 A | * | 8/1997 | Temple et al. | |
| 6,089,442 A | * | 7/2000 | Ouchi et al. | ............. 228/180.1 |
| 6,130,110 A | * | 10/2000 | Hashimoto | .................. 438/106 |
| 6,432,239 B1 | * | 8/2002 | Mandai et al. | ........... 156/89.12 |

FOREIGN PATENT DOCUMENTS

| | | |
|---|---|---|
| JP | 11-126820 | 5/1999 |
| JP | 2004-514313 | 5/2004 |
| KR | 2002-0037070 | 5/2002 |

OTHER PUBLICATIONS

Webster's dictionary, Houghton Mifflin Company, 1995, p. 875.*

* cited by examiner

Primary Examiner—Ha Tran Nguyen
(74) Attorney, Agent, or Firm—Oblon, Spivak, McClelland, Maier & Neustadt, P.C.

(57) ABSTRACT

A temporary support layer 2 is formed on a semiconductor substrate 1, and the temporary support layer 2 is provided with a hole 4 that reaches the semiconductor substrate 1. The hole 4 is filled in with a conductor material 5, and by pressurizing the conductor material 5, the conductor material 5 and the semiconductor substrate 1 are pressure-bonded. Thereby, an aerial wiring structure whose bonding strength is improved and that has excellent self-sustainability can be obtained.

8 Claims, 3 Drawing Sheets

METHOD FOR FORMING AERIAL METALLIC WIRING ON SEMICONDUCTOR SUBSTRATE

BACKGROUND OF THE INVENTION

1. Field of the Invention

The present invention relates to a method for forming an aerial metallic wiring in a fabricating process of a semiconductor typical in ULSIs.

2. Description of the Related Art

As a conventional technology relating to a method for forming an aerial metallic wiring, there is one, for instance, that is disclosed in Japanese Laid-open Application No. HEI 11-126820.

In this conventional method, an aerial wiring structure is formed in the following way. That is, a temporary film made of a carbon film is formed on a semiconductor substrate, a through-hole and a groove are formed in the temporary film, a Cu alloy film is deposited on the temporary film according to a sputtering method, the Cu alloy film is reflowed by heat-treating at a temperature in the range of 400 to 500 degree centigrade and filled in the groove and the through-hole, a plug for burying the through-hole and a wiring connected to the plug and extending onto the temporary film are formed (hereinafter referred to as "a reflow method"), thereafter the temporary film is burned and removed, and thereby an aerial wiring structure made of a Cu alloy is formed on semiconductor substrate.

In the conventional reflow method, since a bonding strength between the plug and the semiconductor substrate is deficient and the plug and the semiconductor substrate are likely to peel off, there are problems in that the aerial wiring may partially separate or an entirety thereof is likely to collapse.

Accordingly, the present invention intends to provide a method for forming an aerial metallic wiring in which a problem of bonding strength deficiency between the conventional plug and the semiconductor substrate is overcome, the bonding strength is improved, and an aerial wiring structure having excellent self-sustainability can be formed.

SUMMARY OF THE INVENTION

In order to accomplish the above intentions, the present invention relies on the following measures. That is, the present invention relates to a method for forming an aerial metallic wiring above a semiconductor substrate and includes the following steps: a temporary support layer is formed on the semiconductor substrate; a hole that penetrates through the temporary support layer and reaches the semiconductor substrate is disposed in the temporary support layer; the hole is filled in with a conductor material; the conductor material is pressurized, and thereby the conductor material and the semiconductor substrate are pressure-bonded; and the aforementioned temporary support layer is removed, resulting in an aerial wiring structure in which the conductor material is self-sustained in a space above the semiconductor substrate.

According to the present invention, since the bonding is performed according to the pressure bonding, in comparison with a conventional reflow method due to a reflow bonding, the bonding strength between the conductor material and the semiconductor substrate can be improved.

When a pressure is applied according to the present invention, the pressure is 30 MPa or more.

The application of the pressure is preferable to be hydrostatic pressurization.

The hydrostatic pressurization is preferably carried out in a gas atmosphere of a high temperature and a high pressure.

Still furthermore, the present invention may be configured so as to further include the following steps: after the disposition of the hole, a groove that communicates with the hole is disposed; simultaneously with filling in the hole with the conductor material, the groove is filled in with the conductor material; and the conductor material in the hole and the semiconductor substrate are pressure-bonded followed by removing an excess conductor material positioned upward than the groove.

After the above aerial wiring structure is formed, a passivation layer is preferably formed on a surface of the wiring structure to suppress a surface diffusion phenomenon of the conductor material from occurring.

Prior to the pressurization, a passivation material may be interposed between the temporary support layer and the conductor material to suppress causing a surface diffusion of the conductor material.

In order to form the aerial wiring structure into a multi-layered one, after the conductor material in the hole and the semiconductor substrate are pressure-bonded, a second temporary support layer that has a hole that extends to a underlying conductor material and is filled in with a second conductor material is formed on the temporary support layer, the second conductor material is pressurized, and thereby the second conductor material and the conductor material underlying thereunder are pressure-bonded.

According to the present invention, in a field of ULSIs that will be furthermore forwarded in higher speed and miniaturization, an aerial wiring structure that is construed as an ultimate low dielectric constant structure and a key to the higher speed can be fabricated over an entire wafer surface with a practically sufficient strength and with a high product yield.

DESCRIPTION OF THE PREFERRED EMBODIMENTS

In the following, with reference to the drawings, modes for implementing the present invention will be explained.

What is shown in the present implementation mode relates to the formation of a metallic wiring structure having an aerial structure in a fabricating process of a semiconductor typical in ULSIs. In particular, the present implementation mode relates to one in which by use of a PVD method, a CVD method, a plating method or a combination of the above deposition methods, a film of a wiring material is formed, and the film of wiring material is pressurized in a gas atmosphere of a high temperature and a high pressure (gas pressure annealing). According to the process, a wiring film material can be filled in the hole or the groove, and the bonding strength between the wiring layer of the underlying semiconductor substrate and the wiring material filled in the hole portion can be improved, resulting in an aerial wiring structure having excellent self-sustainability.

In FIG. 1, a process for forming an aerial wiring structure is schematically shown with a one-layer wiring structure as a model.

Figure 1A:
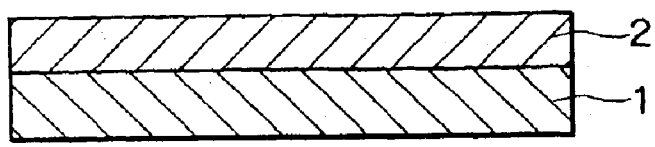
FIGS. 1A to 1G show process drawings showing a mode for implementing the present invention.

In FIG. 1A, a temporary support layer 2 is formed on a semiconductor substrate 1.

The semiconductor substrate 1 is made of a silicon wafer and provided with elements thereon.

The temporary support layer 2, when a structure of a conductor wiring is formed on the semiconductor substrate 1, works as a layer that endows the conductor wiring with a shape and holds the same.

A material of the temporary support layer 2 may be a heat-disappearing material in an oxidizing atmosphere such as carbon shown in the aforementioned conventional technology, an organic material elutable with a solvent such as an appropriate organic solvent or a super-critical carbon dioxide gas, alternatively a silicon dioxide based material that can be removed with a fluorine based gas such as hydrofluoric acid.

However, when a heating step is included in an intermediate process other than the step of removing the temporary support layer 2, for instance, when the gas pressure annealing or the like is included, the material of the temporary support layer is required to have a stable mechanical strength necessary at the processing temperature.

Figure 1B:
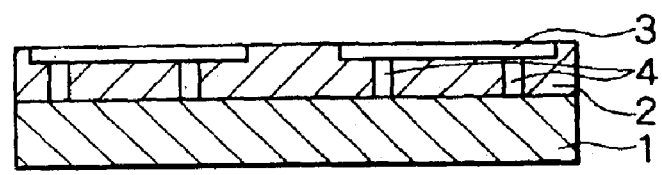

Subsequently, as shown FIG. 1B, the temporary support layer 2 is provided with a groove 3 formed on a surface thereof and a hole 4 penetrating through in a thickness direction thereof. The particular hole 4 and groove 3 are communicated with each other.

The groove 3 is disposed to form an in-plane wiring, and the hole 4 is disposed to form a column for connecting with an element such as a transistor and so on or a wiring layer of the underlying semiconductor substrate 1.

In the drawing, the groove 3 and the hole 4 are formed in one step. Actually, since the groove 3 and the hole 4 are sequentially formed by use of an etching method that uses a mask formed of a photoresist, two steps or more are necessary in many cases.

Figure 1C:
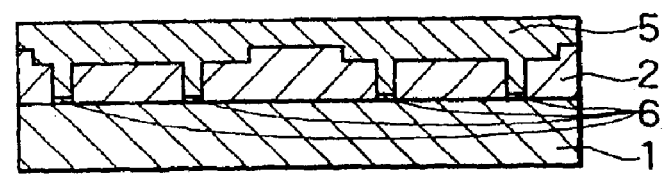

Next, as shown in FIG. 1C, the hole 4 and the groove 3, and a surface of the temporary support layer 2 are covered with a conductor material 5.

The formation of the conductor material 5 can be performed, by use of a PVD method, a CVD method or a plating method, by covering a surface of the temporary support layer 2 therein the groove 3 and the hole 4 are formed with the conductor material 5.

Since it is natural that the conductor material 5 is preferable to be smaller in electrical resistance, a metal is usually used. As typical conductor materials, Al (aluminum) and Cu (copper) or alloys mainly made thereof can be cited. In recent years, Cu that is advantageous from a viewpoint of electrical resistance is widely used. In this case, in the covering and depositing, a PVD method or a two-stage process is used. In the two-stage process, after an initial electrode is formed according to the PVD method, an electroplating method is used.

When these methods are used, in particular when the PVD method is used, since a deposition material is supplied as particles knocked out of a target consisting of a deposition material opposite to the semiconductor substrate 1, when a depth is large relative to a diameter of an opening of the hole 4, it is difficult to form a dense film down to a bottom of the hole 4, or as shown in FIG. 1C, there frequently remains a portion (residual void 6) where the inside of the hole 4 cannot be filled in with the conductor material 5. A shape of the residual void 6, without restricting to spaces shown in FIG. 1C, may be a void in the conductor film material 5 as shown in FIG. 1G.

Accordingly, when the temporary support layer 2 is removed in a later step, there tends to occur problems in that the wiring structure may not be connected with the underlying layer 1 or the wiring structure may easily collapse.

Accordingly, not only the voids 6 occurring in this step, but also factors that may cause a lower density and strength deficiency thereof are necessary to be removed. In particular, when the hole 4 is slender and deep, after the temporary support layer 2 is removed, there remains a slender and long column. Accordingly, in particular, the strength at a foot (bottom of the hole 4) and perfectness in the bonding with the underlying layer are required.

Figure 1D:
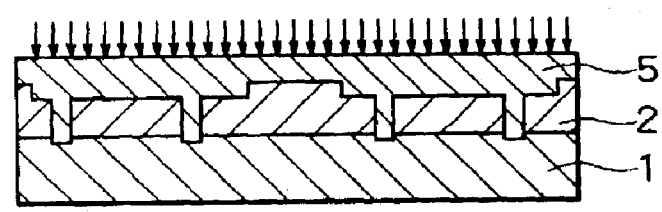

Accordingly, as shown in FIG. 1D, in order to remove such a residual void 6 mainly at the bottom of the hole 4 and to improve a bonding strength with the underlying layer 1, a step of pressurization is carried out.

In the pressurization, a surface of the conductor material 5 is preferably pressurized with a hydrostatic pressure. The hydrostatic pressurization is carried out in a gas atmosphere under a high temperature and a high pressure. As a pressurizing medium, an Ar gas is adequate.

In the pressurizing step (gas pressure annealing) with the high temperature and high pressure gas, the conductor material 5 destined to be a wiring is deformed according to a creep phenomenon and the residual void 6 is crushed, and at the same time, owing to a vertical direction stress applied at the bottom of the hole 4 at this time, diffusion bonding or an improvement in a close contact with the semiconductor substrate 1 is attained. Accordingly, conditions of the pressurizing process are different according to the conductor material 5 or the diameter and depth of the hole 4.

When, for instance, a diameter of the hole 4 is in the range of 0.15 to 0.5 $\mu$m, a depth is substantially 1 $\mu$m, and the conductor material 5 is an aluminum alloy, a temperature in the range of 200 to 450 degree centigrade, preferably 300 to 450 degree centigrade, a pressure in the range of 30 to 100 MPa and a holding time in the range of substantially 10 to 300 seconds are sufficient.

Furthermore, in the case of the conductor material 5 being Cu, when the Cu is deposited by the ordinary PVD method alone, since the creep phenomenon is difficult to occur, 450 to 500 degree centigrade, 100 to 200 MPa and a holding time of 5 to 30 minute are necessary. However, though it is the same Cu, when the Cu film is formed by use of the electroplating or a PVD with added hydrogen, since a temperature where the creep phenomenon occurs becomes lower, 350 to 450 degree centigrade, 100 to 200 MPa and a holding time of substantially 5 to 15 minute can cause an excellent bonding effect.

Figure 1E:
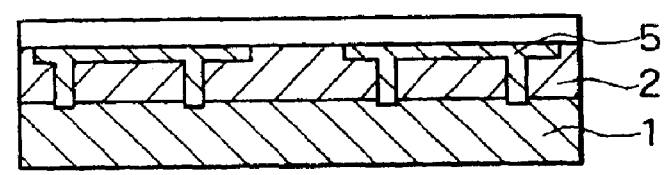

Then, as shown in FIG. 1E, the conductor material 5 of the portion upward than a surface of the temporary support layer 2, being in excess, by use of chemical mechanical polishing method, is removed while securing the flatness of the surface. Actually, although after this step, a furthermore upper layer is formed, an explanation thereof is omitted because this is a model structure.

Figure 1F:
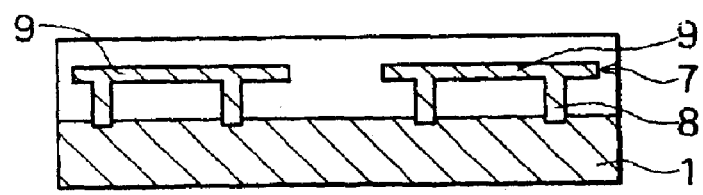
Figure 1G:
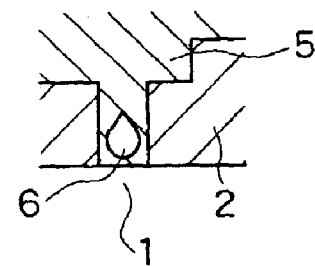

FIG. 1F shows a state where the removal step of the temporary support layer 2 has come to completion and an aerial wiring 7 has been formed. In the aerial wiring 7, a portion corresponding to the hole 4 is a column portion 8 and a portion corresponding to the groove 3 is a wiring portion 9.

The method for removing the temporary support layer 2 is different according to a material of the temporary support layer 2, and a method the same as the conventional method is used.

According to the aforementioned implementation mode of the present invention, owing to the gas pressure annealing step, the underlying semiconductor substrate 1 and the in-plane wiring 7 formed in the air are connected, and the strength of the holding column portion 8 is secured. Accordingly, the wiring is hindered from coming off or coming down.

FIGS. 2A through 2E show an example of a two-layered wiring structure.

Figure 2A:
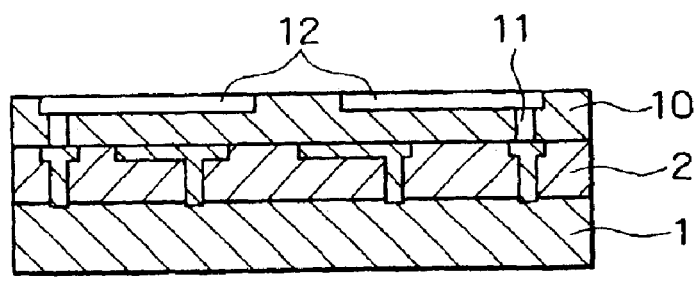
FIGS. 2A to 2E show process drawings showing another mode for implementing the present invention.

In FIG. 2A, on the semiconductor substrate gone through up to the step shown in FIG. 1E, a second temporary support layer is formed. Following steps are fundamentally the same as those shown in FIG. 1.

That is, on the temporary support layer 2 gone through up to the step shown in FIG. 1E, a second temporary support layer 10 is formed. The second temporary support layer 10 has a hole 11 that comes down to the underlying conductor material 5 and a groove 12 (FIG. 2A).

Figure 2B:
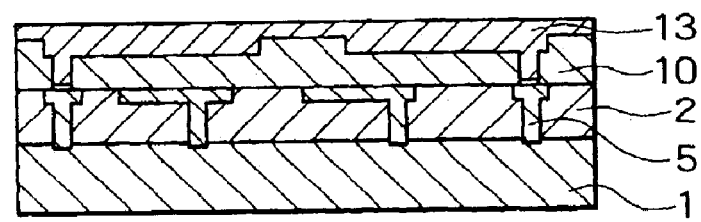

The hole 11, the groove 12 and a surface of the second temporary support layer 10 are filled in with a second conductor material 13 (FIG. 2B).

Figure 2C:
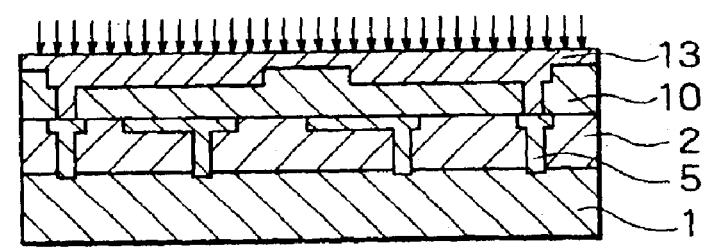

Subsequently, when the second conductor material 13 is pressurized, the second conductor material 13 and the underlying conductor material 5 are pressure-bonded (FIG. 2C).

A material of the second temporary support layer 10 is the same as that of the underlying temporary support layer 2. Furthermore, the second conductor material 12 is also the same as that of the underlying conductor material 5.

Figure 2D:
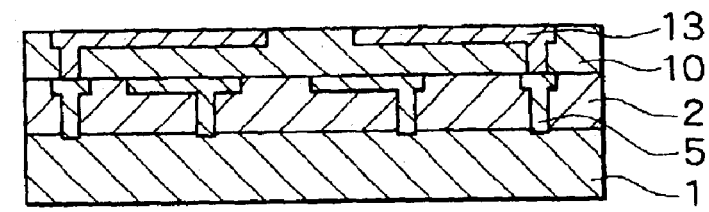
Figure 2E:
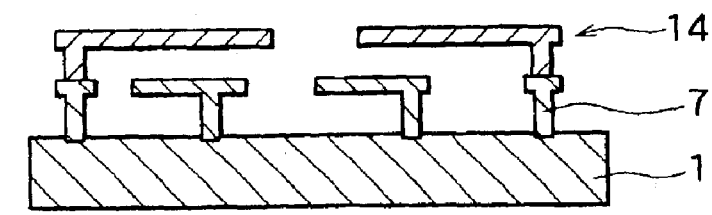

Thereafter, the second conductor material 12 upward than the second temporary support layer 10 is removed by use of the CMP method and is planarized (FIG. 2D).

Then, the underlying temporary support layer 2 and the second temporary support layer 10 are removed in the method similar to the conventional one, and thereby a two-layered aerial wiring 14 can be obtained.

In this case, in order to eliminate the residual voids at the bottom of the hole 11, the gas pressure annealing is performed. When such the multi-layered structure is taken, when the structure is simple such as that the holes 4 and 11 are located in the substantially same positions through an entire layers, only one gas pressure annealing process after the formation of the last wiring may collectively eliminate the residual voids at the bottoms of the underlying holes 4.

Furthermore, an aerial wiring structure having a multi-layered structure more than two layers also can be obtained according to a stacking method similar to the above.

FIG. 3 illustrates an example in which it is utilized that when the gas pressure annealing is used, even when the bottom portion of the hole 4 is structured expanded than an opening thereof, the conductor material 5 can be filled in owing to the creep phenomenon.

Figure 3A:
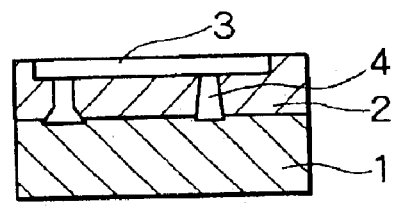
FIGS. 3A to 3E show process drawings showing still another mode for implementing the present invention.
Figure 3B:
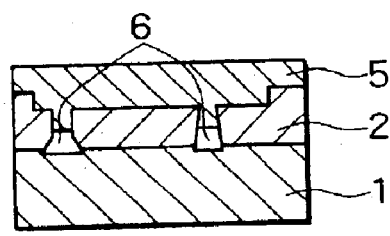
Figure 3C:
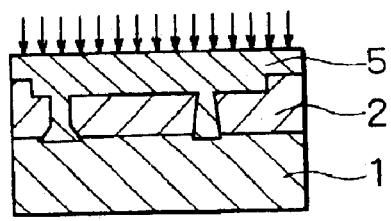
Figure 3D:
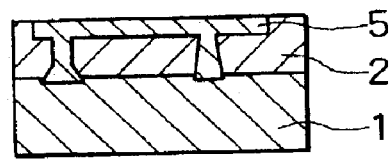
Figure 3E:
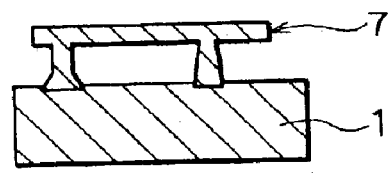

Specifically, when the column portion 8 is finally formed and supports an entire wiring structure, the column portion 8 is necessary to have a mechanical strength at the foot thereof 8. Accordingly, in order to make a contact area larger in the neighborhood of the bottom of the hole 4, the hole is formed into an inverse tapered shape. Even when the hole 4 is thus structured, as shown in FIG. 3C, the conductor material 5 is pushed into an entirety of the hole 4 owing to the pressure, resulting in the elimination of the residual voids 6.

Figure 4:
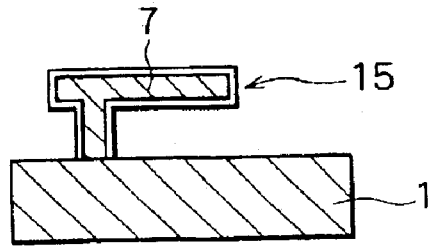
FIG. 4 is a sectional view in which a passivation layer is arranged on a surface of an aerial wiring structure.

FIG. 4 shows a method of hindering disconnection resulting from diffusion of a flow of electrons of conductor atoms due to electromigration (EM) phenomenon that is anxious in the actual aerial wiring 7.

The diffusion of the conductor atoms is said to be mainly a surface diffusion and is likely to occur when a surface is exposed to an air or a vacuum. Accordingly, in order to suppress the surface diffusion from occurring, the conductor material is preferable to be covered with a film of a stable material (passivation film 15) that is non-reactive with the conductor material 5. As a material of the passivation film 15 like this, a SiN based insulating film (deposited with silane and ammonia as raw material gases) can be cited as a typical example. When it is an electrically insulating material, even when the film is formed down to a Si substrate 1 at the lower-most layer, there is no anxiety of occurrence of electrical dielectric breakdown or the like. Furthermore, the function of the passivation has an effect of suppressing an influence of an ambient atmosphere, for instance, of humidity or the like.

The formation of the passivation film 15 is realized by, after the formation of the hole 4 and the groove 3 in the temporary support layer 2, covering the insides of the hole 4 and the groove 3 by use of the CVD method or the like.

Furthermore, as a method of forming the passivation layer on an entire aerial wiring structure, there is a method of depositing a film after the aerial wiring 7 is formed.

That is, after the aerial wiring 7 is formed according to the aforementioned method, the passivation film 15 is given with a deposition technique. Since it is preferable to form on an entire surface of the conductor structure, the use of the CVD method is recommended

EMBODIMENTS

In the following, embodiments of the present invention will be explained.

Embodiment 1 and Comparative Embodiment 1:

On each of two Si wafers (semiconductor substrate 1) on each of which as a temporary support layer 2 a $SiO_2$ film (thickness: 2 $\mu$m) with a hole 4 (diameter: 0.25 $\mu$m) was formed, a TaN layer was formed with a thickness of 50 nm at a surface of the wafer followed by the formation of a seed layer for use in electroplating having a thickness of 150 nm by use of the PVD method.

Subsequently, as a conductor material 5, a Cu layer having a thickness of 1.5 $\mu$m is formed by use of the electroplating method. One of the two wafers underwent an ordinary annealing in a reduced pressure atmosphere electric furnace in a nitrogen atmosphere at 400 degree centigrade for 30 min (Comparative Embodiment 1), and the other one underwent the gas pressure annealing according to the present invention at the same temperature of 400 degree centigrade, and 150 MPa (Embodiment 1).

An excess Cu layer on a surface of each of the wafers was removed by use of the CMP method followed by processing with a hydrogen fluoride gas, and thereby the $SiO_2$ layer of the temporary support layer 2 was removed.

When the wafers were observed after the removal of the $SiO_2$ layer, it was confirmed that while in the ordinarily annealed one (Comparative Embodiment 1), Cu of a column portion 8 (cylindrical rod) hardly remained except a wafer center portion, in the gas pressure annealed one (Embodiment 1), Cu of the column portion 8 regularly stood up.

Embodiment 2 and Comparative Embodiment 2:

Two sample wafers each of which had the model structure shown in FIG. 1 (diameter of the hole 4: 0.25 μm, depth: 0.65 μm, width of the groove 3: 0.4 μm, and depth: 0.5 μm) were prepared. For a material of the temporary support layer 2, carbon obtained by coating phenolic resin followed by a thermal process was used. Except for the formation of the TaN layer and the seed film, other than that an entire Cu film was formed by means of the electroplating, a method similar to that of Embodiment 1 and Comparative Embodiment 1 was employed.

After an excess Cu was removed by use of the CMP method, the samples were heated in air with a temperature rise speed of 5 degree centigrade an hour from 300 to 550 degree centigrade followed by holding there for 1 hr. The obtained samples were observed.

In the ordinarily annealed sample (Comparative Embodiment 2), although the aerial wiring structures were confirmed at several positions of the wafer center, the wiring structure sufficiently formed over the entire wafer surface could not be obtained.

On the other hand, in the gas pressure annealed sample (Embodiment 2), it was confirmed that the aerial wiring structure substantially the same as that shown in FIG. 1F was formed over a substantially entire wafer surface.

The present invention is not restricted to ones shown in the above implementation modes and Embodiments.

What is claimed is:

1. A method of forming an aerial metallic wiring on a semiconductor substrate, comprising:

forming a temporary support layer on a semiconductor substrate;

disposing a hole that penetrates through the temporary support layer and reaches the semiconductor substrate;

filling in the hole with a conductor material;

hydrostatic pressurizing the conductor material, and thereby pressure-bonding the conductor material and the semiconductor substrate; and removing the temporary support layer, and thereby forming the conductor material into an aerial wiring structure that is self-sustained in a space above the semiconductor substrate.

2. The method of forming an aerial metallic wiring as set forth in claim 1, wherein a pressure at the pressurizing is 30 MPa or more.

3. The method of forming an aerial metallic wiring as set forth in claim 1, further comprising:

disposing, after the disposition of the hole, a groove that communicates with the hole;

filling in the hole with the conductor material and at the same time filling in the groove with the conductor material; and after the conductor material in the hole and the semiconductor substrate are pressure-bonded, an excess conductor material in a upper portion than the groove is removed.

4. The method of forming an aerial metallic wiring as set forth in claim 1, wherein the hydrostatic pressurizing is performed in a gas atmosphere of a high temperature and a high pressure.

5. The method of forming an aerial metallic wiring as set forth in claim 4, wherein the hydrostatic pressurizing is performed at a temperature of 200 degree centigrade or more.

6. The method of forming an aerial metallic wiring as set forth in claim 1, further comprising:

before the removal of the temporary support layer, forming a second temporary support layer on the temporary support layer;

disposing, in the second temporary support layer, a second hole that reaches an underlying conductor material;

filling in the second hole with a second conductor material; and pressurizing the second conductor material and thereby pressure-bonding the second conductor material and the underlying conductor material.

7. The method of forming an aerial metallic wiring as set forth in claim 1, further comprising:

forming a passivation layer on the inner surface of the hole, after the disposition of the hole and before filling the hole with the conductor material.

8. The method of forming an aerial metallic wiring as set forth in claim 3, further comprising:

forming a passivation layer on the inner surface of the hole, after the disposition of the hole and the groove and before filling the hole and the groove with the conductor material.

* * * * *

UNITED STATES PATENT AND TRADEMARK OFFICE
CERTIFICATE OF CORRECTION

PATENT NO.    : 6,916,735 B2
DATED         : July 12, 2005
INVENTOR(S)   : Fujikawa et al.

It is certified that error appears in the above-identified patent and that said Letters Patent is hereby corrected as shown below:

<u>Title page,</u>
Item [73], should read:
-- [73] Assignee: **Kabushiki Kaisha Kobe Seiko Sho
                  (Kobe Steel, Ltd.)** Kobe (JP) --.

Signed and Sealed this

Sixth Day of September, 2005

JON W. DUDAS
*Director of the United States Patent and Trademark Office*